(12) United States Patent
Biegelsen et al.

(10) Patent No.: US 7,890,043 B2
(45) Date of Patent: Feb. 15, 2011

(54) PRESSURE-CONTROLLED STEAM OVEN FOR ASYMPTOTIC TEMPERATURE CONTROL OF CONTINUOUS FEED MEDIA

(75) Inventors: David K. Biegelsen, Portola Valley, CA (US); Ashish Pattekar, Cupertino, CA (US); Armin R. Volkel, Mountain View, CA (US); Lars-Erik Swartz, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 633 days.

(21) Appl. No.: 11/959,406

(22) Filed: Dec. 18, 2007

(65) Prior Publication Data
US 2009/0154969 A1    Jun. 18, 2009

(51) Int. Cl.
*G03G 15/20* (2006.01)
(52) U.S. Cl. ...................................... 399/335
(58) Field of Classification Search ............... 399/91, 399/320, 335
See application file for complete search history.

(56) References Cited
U.S. PATENT DOCUMENTS
5,318,792 A    6/1994 Tippmann 6,067,437 A * 5/2000 Schonfeld .................... 399/320
6,334,033 B1 * 12/2001 Ayash et al. .................. 399/91

* cited by examiner

Primary Examiner—William J Royer
(74) Attorney, Agent, or Firm—Bever, Hoffman & Harms, LLP; Patrick T. Bever

(57) ABSTRACT

A non-atmospheric pressure vapor oven system that utilizes a controllable pressure zone to facilitate fast phase change heat transfer at any desired temperature to heat or cool flat substrates, and to level temperatures across different locations of the substrates. The system enables the use of a heat transfer fluid, such as water, without being limited to a particular temperature, such as the fluid's natural boiling point at atmospheric pressure. The system includes a vapor oven (hermetic enclosure) defining a pressure chamber having sealed entry and exit ports for transferring an object (e.g., a sheet of paper) with added material (e.g., toner) through the pressure chamber, and a pressure regulation apparatus for setting the saturation temperature (boiling point) of heat transfer fluid inside the vapor oven to an optimal heating/cooling temperature by selectively controlling the pressure inside the hermetic enclosure.

12 Claims, 2 Drawing Sheets

© 1

PRESSURE-CONTROLLED STEAM OVEN FOR ASYMPTOTIC TEMPERATURE CONTROL OF CONTINUOUS FEED MEDIA

FIELD OF THE INVENTION

This invention relates to steam-based manufacturing systems, and in particular to steam fusers for xerographic systems.

BACKGROUND OF THE INVENTION

In xerographic or electrostatographic printers (collectively referred to herein as "xerographic systems"), a charge-retentive member is charged to a uniform potential and thereafter exposed to a light image of an original document to be reproduced. The exposure discharges a charge-retentive surface of the charge-retentive member in exposed or background areas and creates an electrostatic latent image on the charge-retentive member which corresponds to image areas contained within the original document. Subsequently, the electrostatic latent image on the charge-retentive surface is rendered visible by developing the electrostatic latent image with developing powder. Many development systems employ a developer material which comprises both charged carrier particles and charged toner particles which triboelectrically adhere to the carrier particles. During development, the toner particles are attracted from the carrier particles by a charge pattern of the image areas on the charge-retentive surface to form a powder image on the charge-retentive surface. This image is subsequently transferred to a substrate (e.g., a sheet of paper), which is then transferred through a fuser to permanently affix the toner to the substrate by applying heat and/or pressure that causes the temperature of the toner material to be elevated to a temperature at which the toner material coalesces and becomes tacky. This heating causes the toner to flow to some extent into the fibers or pores of the substrate. Thereafter, as the toner material cools, solidification of the toner material causes the toner material to become bonded to the substrate.

Xerographic systems utilize either contact type fusers, such as the pressure fuser mentioned above, or contactless systems such as flash, radiant or steam fusers to fix toner material to a substrate.

In contact type fusers, the substrate is pressed between two rollers, at least one of which is heated to a temperature high enough to cause the toner to bind to the substrate. However, contacting methods are problematic because they result in poor heat coupling to the media due to media roughness and a trapped air layer between the media and the heat transfer surface.

Steam fusers utilize a steam oven to rapidly heat the substrate to the desired temperature in order to affix the toner. A cool substrate leaves a toner transfer apparatus and is directed into a steam oven containing steam at a temperature of approximately 180° C.±10° C.). The substrate is thus heated by steam condensation and concomitant release of latent heat, as well as by convective heat transfer to the desired temperature. During the first moments of this heating process, until the substrate surface temperature approaches the boiling point of water at the operating pressure, heating of the substrate is predominantly achieved through steam condensation heat transfer, which usually occurs in a time of order of 100 milliseconds (ms), independent of steam temperature. A condensate liquid layer approximately 4 microns thick (dependent on the heat capacitance of the substrate) results during this condensation heating process that must be re-evaporated and before the substrate can be heated above the boiling point (e.g., 100° C.). Re-evaporation of the condensate liquid layer takes about one second, during which this liquid layer can be rapidly imbibed by capillary infusion into the fiber matrix of the substrate (if uncoated). When the moisture content at the center of a substrate exceeds a level of approximately 10% by weight, the fibers are able to move and relax non-uniform stresses (built into the paper during manufacture by cooling and quenching-in the non-uniform stresses under pressure and hygro-expansivity). This is called cockling and is undesirable. Once the cockling appears, subsequent drying of the unconstrained paper is not effective in reversing the distortion.

What is needed is a steam fuser for a xerographic system in which the substrate can be heated rapidly without building up an appreciable thickness of water on the surface (minimizing the 'condensation zone' time in the steam oven in order to minimize cockle).

SUMMARY OF THE INVENTION

The present invention is directed to a non-atmospheric pressure steam (or other vapor) oven system and method that utilize a controllable pressure zone to facilitate fast phase change heat transfer at any desired temperature to heat or cool target objects (e.g., flat substrates, such as sheets of paper), and also to the use of this system/method for leveling of temperatures across different locations of the objects. The system/method enables the use of a heat transfer fluid, such as water, without being limited to a particular temperature, such as the fluid's natural boiling point at atmospheric pressure. The invention also enables the use of fast phase change heat transfer processes for heating/cooling various thin substrates (e.g., in printing applications for paper/plastics/packaging materials or in other manufacturing applications with thin substrates which require fast efficient heat transfer) without being limited to the natural boiling point temperature of the heat transfer fluid at standard atmospheric pressure. The system/method may be utilized in other manufacturing applications as well.

In accordance with an embodiment of the present invention, the steam oven system includes a steam oven (hermetic enclosure) defining a pressure chamber having sealed entry and exit ports for transferring a web or substrate (i.e., an object such as a sheet of paper) with added material (e.g., a markant such as toner, wax, components to be glued, etc.) through the pressure chamber, and a temperature/pressure regulation apparatus for setting the saturation temperature (boiling point) of heat transfer fluid inside the steam oven to an optimal heating/cooling temperature by selectively controlling the pressure inside the hermetic enclosure. For example, by reducing the pressure from one standard atmosphere to 0.2 bars absolute (−12 psig or 3 psia), the boiling temperature of water is reduced from 100° C. to 60° C. Thus, the saturated steam temperature at equilibrium under these conditions is also 60° C., and the phase change between liquid and vapor, with its concomitant exchange of latent heat, occurs at 60° C. Similarly, the boiling point can be increased to 120° C. by raising the system pressure to 1 atmospheres (15 psig). Objects such as a sheet of paper in this environment would tend toward an equilibrium in a self-limiting way at the selected boiling point—those objects at temperatures higher than the saturation temperature would tend to evaporatively cool by losing any native moisture (e.g., a sheet of paper entering the system with typical 6 to 8% moisture content), and those with temperatures lower than the saturation temperature would tend to heat up due to condensation heat transfer from the surrounding steam. This process enables efficient heating and cooling of the object to the desired temperature and also in leveling of any temperature non-uniformities in the object. In another mode of use a substrate can be rapidly heated by condensation to temperatures well above 100° C. For example, if it is desired to heat the substrate to 110° C., the boiling point can be set to 120° C., say, and the substrate dwell time in the steam environment set to achieve heating to 110° C. The heating rate is much faster below the asymptotic temperature than close to the boiling temperature.

In an exemplary embodiment, the steam oven system is disposed downstream from a toner transfer device in a xerographic system, water is used as the heat transfer fluid and is stored in a reservoir within, or in direct communication with, the pressure chamber. The heat transfer fluid is heated by a heater to a controlled set point temperature. The pressure chamber equilibrates to the vapor pressure of the heat transfer fluid at the set temperature. Optimal conditions are generated such that an internal pressure of the pressure chamber is different from (i.e., above or below) an atmospheric pressure external to the pressure chamber, and such that a temperature inside the pressure chamber is equal to or greater than the boiling point temperature of the heat transfer fluid at the internal pressure. The substrate, with un-fused toner material disposed thereon, is then transferred through the pressure chamber by way of the sealed entry and exit portions (i.e., such that no significant change occurs in the pressure differential between the internal pressure of the pressure chamber and the external atmospheric pressure), thereby heating the substrate to the internal temperature and fusing the toner material to the substrate. This arrangement facilitates the production of xerographic systems in which the peak temperature of the fusing process may be substantially lower (or higher) than the standard boiling temperature of water at atmospheric pressure (i.e., 100° C.).

Various pressure seal methods are used to provide the sealed entry and exit ports. In one embodiment, the sealed entry and exit ports include compliant roller nips that serve to transport a substrate (e.g., a sheet of paper) through the pressure chamber. Heated walls largely enclose the roller nips so that condensation is minimized on the rollers in the region outside the chamber. In other embodiments, multiple walls that open and close are used (e.g., two parallel walls on the substrate input and output sides) that act as a 'load lock' to provide a transition region for entry and exit without loss of pressure in the internal pressure chamber. In yet another alternative embodiment, a differentially pumped outer chamber is provided in lieu of nip sealing. Air entering or vapor leaving the pressure chamber are exhausted (and optionally recycled) by pumping the outer chamber to a pressure lower than both the atmospheric and pressure chamber pressures.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in steam fuser apparatus for xerographic systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

As used herein, the term "vapor" is the condensable gas phase component of a liquid that is in actual or virtual contact with its liquid phase, and is distinguished from the pure gas phase by the presence of the liquid phase. In the exemplary embodiments provided below, steam is used as an example of (water) vapor that is formed over and in contact with a pool of liquid water. In other embodiments (not shown), a non-atmospheric pressure steam oven system may utilize a non-water heat transfer fluid in which the generated vapor does not comprise steam.

Figure 1:
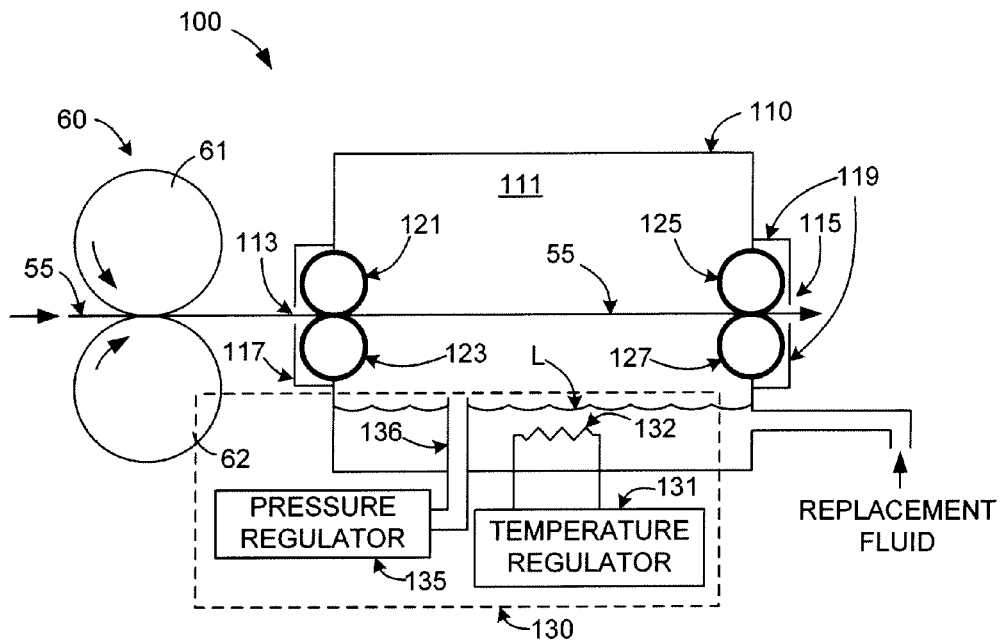
FIG. 1 is a simplified side view showing a non-atmospheric pressure steam oven system according to an embodiment of the present invention.

FIG. 1 is a simplified side view showing a portion of a xerographic system including a non-atmospheric pressure steam oven system 100 according to an exemplary embodiment of the present invention. Steam oven system 100 is positioned immediately downstream of a toner transfer device 60 that utilizes two rotating drums 61 and 62 to transfer toner onto a substrate 55 in a predetermined pattern according to known xerographic techniques.

Steam oven system 100 generally includes a steam oven (hermetic enclosure) 110 defining a controllable pressure chamber 111, and a temperature/pressure regulation apparatus 130. In a manner similar to that performed by steam fusers in conventional xerographic systems, steam oven system 100 utilizes water-based steam to heat substrate 55 to a predetermined optimal temperature, and to maintain substrate 55 at or above the predetermined temperature for a predetermined time period in order to facilitate melting of the toner and fusing of the toner to substrate 55. However, unlike the conventional steam fusers, steam oven system 100 controls the pressure in pressure chamber 111 in a way that generates steam at temperatures other than those normally associated with the boiling point of water under atmospheric conditions (i.e., 100° C.). In this way, steam oven system 100 facilitates fast phase change heat transfer at a predetermined temperature to heat (or in other applications, to cool) substrate 55, and also to level the temperatures across different locations of substrate 55, thus optimizing the fusing process for a selected toner.

Steam oven 110 is constructed using conventional materials and manufacturing techniques such that pressure chamber 111 is airtight and sufficiently strong to withstand a pressure differential between pressure chamber 111 and external atmospheric conditions. Steam oven 110 is accessible by way of a sealed entry port 113 and a sealed exit port 115. In the exemplary embodiments, sealed entry port 113 includes compliant roller nips (wheels) 121 and 123 and sealed exit port 115 includes compliant rollers nips 125 and 127 constructed using conventional materials and manufacturing techniques that serve to transport substrate 55 through pressure chamber 111 without significant loss of pressure. The external walls of steam oven 110 are heated to a temperature slightly above steam temperature, and secondary heated wall portions 117 and 119 enclose roller nips 121/123 and 125/127 to avoid condensation on nips.

In the exemplary embodiment, temperature/pressure regulation apparatus 130 includes a temperature regulator 131 that controls the temperature of liquid heat transfer fluid L, which is disposed in pressure chamber 111, by way of an immersed resistive heater 132 to a controlled set point. In one embodiment, pressure chamber 111 equilibrates to the vapor pressure of heat transfer fluid L at the set temperature. An optional pressure regulation device or pressure regulator (e.g., a pump) 135 further controls the pressure inside pressure chamber 111 by way of pipe 136. Optimal conditions are generated by temperature/pressure regulation apparatus 130 such that an internal pressure of chamber 111 is different from (i.e., above or below) an atmospheric pressure external to the pressure chamber 111, and such that a temperature inside the pressure chamber 111 is equal to or greater than the boiling point temperature of the heat transfer fluid L at the internal pressure. Objects, such as substrate 55 (i.e., a sheet of paper) disposed in pressure chamber 111 would tend toward an equilibrium in a self-limiting way at the selected boiling point—those objects at temperatures higher than the saturation temperature (e.g., higher than 60° C.) would tend to evaporatively cool by losing any native moisture, and those with temperatures lower than the saturation temperature (e.g., higher than 60° C.) would tend to heat up due to condensation heat transfer from the surrounding steam. In the fusing operation context depicted in FIG. 1, the present invention enables efficient heating of substrate 55 to the desired temperature, and also in leveling of any temperature non-uniformities in substrate 55 during the fusing process, thereby facilitating a fusing process at a much lower temperature than under atmospheric conditions.

Figure 2A:
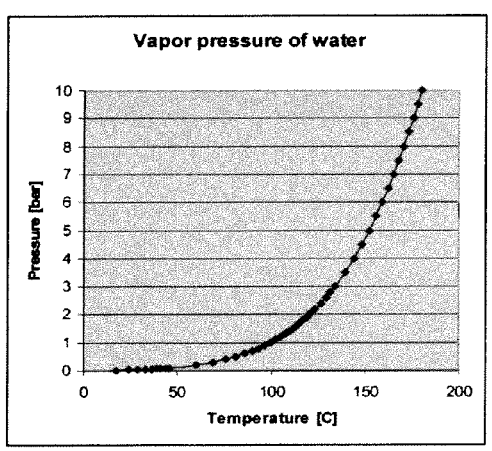
FIGS. 2(A) and 2(B) are graphs showing changes in the vapor pressure of water at various combinations of temperature and pressure.
Figure 2B:
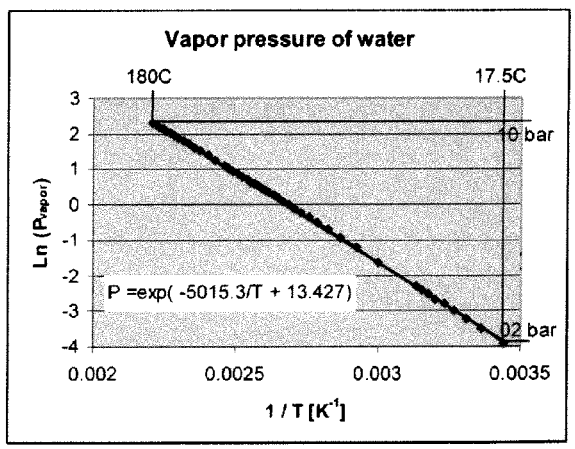

Similarly, in another embodiment, the boiling point can be increased to 120° C. by heating the heat transfer fluid (water) thereby raising the system pressure to 1 atmospheres (15 psig). FIGS. 2(A) and 2(B) show various vapor pressures for water under different pressure and temperature conditions.

An important point of the invention is that the transported substrate will approach equilibrium at or near the boiling point of water at the set pressure in a self-limiting manner. If the substrate enters at a higher temperature, it will dry and cool; if at a lower temperature, it will moisten and heat. A second important aspect of the invention is that rapid condensation heating of substrates can work above 100° C. by having the boiling point be greater than the target substrate temperature. In a variation from the simple approach to equilibration, a hot substrate can be wetted with a surface layer of water before entry to steam oven 110 (e.g., by spraying with water, or passing the substrate through a cool humid environment before entering the hermetic enclosure). In that case the substrate can be cooled without depending on the presence of any native moisture in the bulk of the paper.

Figure 3:
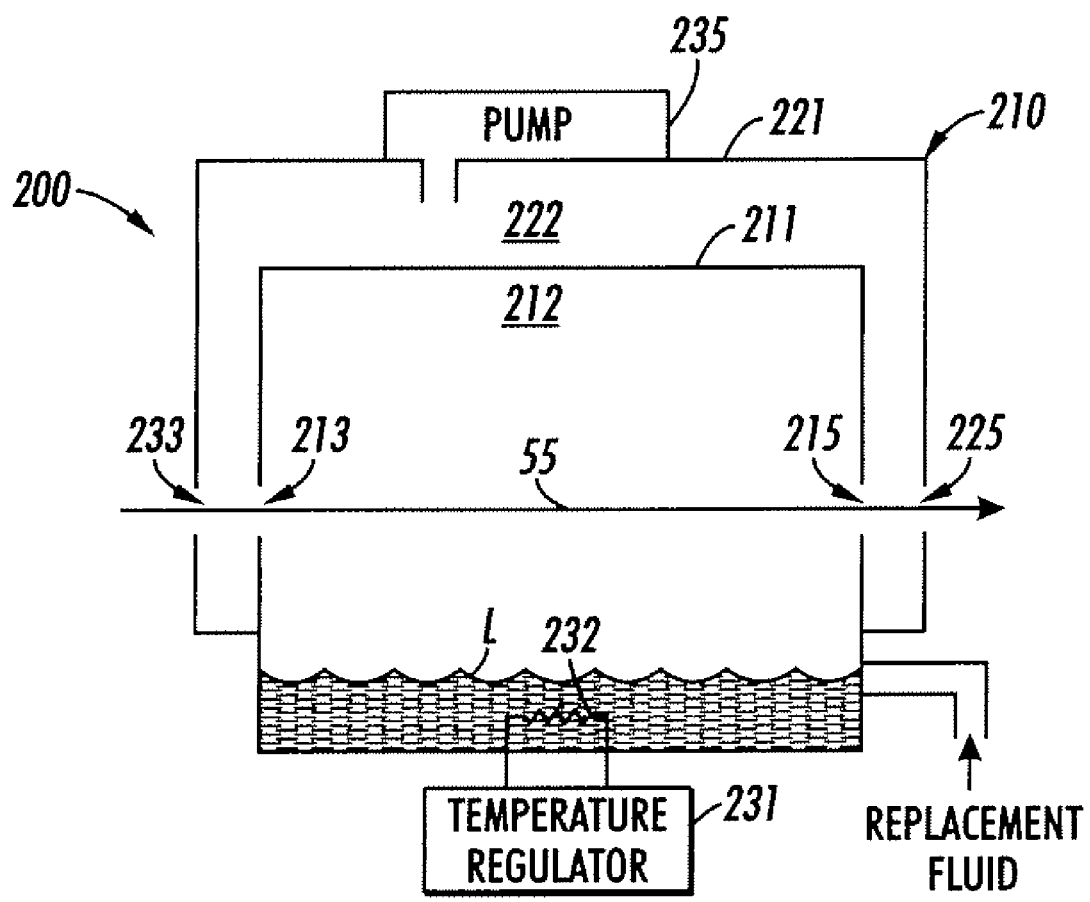
FIG. 3 is a simplified side view showing a non-atmospheric pressure steam oven system according to another embodiment of the present invention.

FIG. 3 is a simplified side view showing a non-atmospheric pressure steam oven system 200 according to another embodiment of the present invention. Steam oven 210 is constructed using conventional materials and includes an inner wall 211 defining an inner (pressure) chamber 212 and an outer wall 221 defining an outer chamber 222. Inner chamber 212 is accessed by way of an entry port 213 and an exit port 215. Outer chamber 222 is accessed by way of an entry port 233 and an exit port 225 that are respectively aligned with entry/exit ports 213 and 215 so that substrate 55 passes through steam oven 210 along a straight path. Heat transfer fluid L is disposed in inner chamber 212 and is heated by, for example, an immersed resistive heater 232 to a set point temperature determined by a temperature regulator (controller) 231. Inner chamber 212 equilibrates to the vapor pressure of heat transfer fluid L at the selected set point temperature. Optimal conditions are generated such that an internal pressure of inner chamber 212 is different from (i.e., above or below) an atmospheric pressure external to steam oven 210, and such that a temperature inside inner chamber 212 is equal to or greater than the boiling point temperature of heat transfer fluid L at the internal pressure. A pump 235 maintains outer chamber 222 at a pressure that is lower than both the atmospheric pressure located outside steam oven 210 and inner (pressure) chamber 212, thereby exhausting (and optionally recycling) both air entering outer chamber 222 from outside steam oven 210 through entry/exit ports 233 and 225, and steam (or other vapor) entering outer chamber 222 from inner chamber 212 through entry/exit ports 213 and 215. Thus, differentially pumped outer chamber 222 is provided in lieu of the nip sealing arrangement utilized in the embodiment of FIG. 1 (discussed above).

Although the present invention has been described with respect to certain specific embodiments, it will be clear to those skilled in the art that the inventive features of the present invention are applicable to other embodiments as well, all of which are intended to fall within the scope of the present invention. For example, instead of using wheels/rollers to enable sealing of the pressurized/depressurized zone, multiple walls that open and close could be used (e.g., two parallel walls, on each of the substrate input and output side, could act as a 'load lock' that would provide a transition region for substrate entry and exit without significant loss of pressure in the internal hermetic enclosure). Further, although the invention is described as being incorporated as a steam fuser in a xerographic system, the present invention may be utilized in the manufacture of a wide range of products utilizing thin substrates without being limited to the natural boiling point temperature of the heat transfer fluid (e.g., water) at standard atmospheric pressure. Moreover, although the present invention is described as including immersion-type heaters, other systems may be used to heat the heat transfer fluid disposed in or communicating with the vapor oven. Such other applications include self-limited surface heating of any thin objects transported by a web, and controlled melting of layers on a web without over-heating (e.g. thermo-plastic or thermo-setting bonding of chips or other objects to flex PCBs).

The invention claimed is:

1. A non-atmospheric pressure vapor oven system comprising:
    a vapor oven defining a pressure chamber and having entry and exit ports for transferring an object through the pressure chamber; and
    means for controlling an internal pressure inside said pressure chamber such that a saturation temperature of heat transfer fluid disposed inside the pressure chamber is adjusted to a predetermined temperature, wherein said internal pressure inside said pressure chamber is different from an atmospheric pressure external to said vapor oven.

2. The non-atmospheric pressure vapor oven system of claim 1, wherein heat transfer liquid is water and vapor is steam.

3. The non-atmospheric pressure vapor oven system of claim 1, further comprising compliant roller nips disposed in each of said entry and exit ports and arranged such that said object is transferable through said pressure chamber without significant change in a pressure differential between said internal pressure and said atmospheric pressure.

4. The non-atmospheric pressure vapor oven system of claim 1,
wherein said vapor oven comprises an inner wall defining said pressure chamber, said entry port and said exit port, and an outer wall defining an outer chamber disposed such that said entry and exit ports are disposed in said outer chamber, wherein said outer chamber also defines a second entry port aligned with said entry port defined by said inner wall, and a second exit port aligned with said exit port defined by said inner wall, and
wherein said means for controlling includes means for maintaining said outer chamber at a differential pressure that is different from both said atmospheric pressure and said internal pressure inside said pressure chamber.

5. The non-atmospheric pressure vapor oven system of claim 1, wherein said entry port comprises multiple walls that cooperatively open and close such that said object is insertable into said pressure chamber without significant change in a pressure differential between said internal pressure and said atmospheric pressure.

6. The non-atmospheric pressure vapor oven system of claim 1, wherein said heat transfer fluid comprises a liquid disposed in said pressure chamber, and said means for controlling includes a resistive heater disposed in said pressure chamber and in thermal contact with said liquid.

7. A vapor fuser apparatus for fusing a toner material to a substrate in a xerographic system, the vapor fuser apparatus comprising:
a vapor oven defining a gas-tight pressure chamber and having sealed entry and exit ports for transferring said substrate through the pressure chamber; and
means for controlling an internal pressure inside said pressure chamber such that a saturation temperature of heat transfer fluid disposed inside the pressure chamber is adjusted to a predetermined temperature, wherein said internal pressure inside said pressure chamber is different from an atmospheric pressure external to said vapor oven.

8. The vapor fuser apparatus of claim 7, further comprising compliant roller nips disposed in each of said sealed entry and exit ports and arranged such that said substrate is transferable through said pressure chamber without significant change in a pressure differential between said internal pressure and said atmospheric pressure.

9. The vapor fuser apparatus of claim 7, wherein said heat transfer fluid comprises a liquid disposed in said pressure chamber, and said means for controlling includes a resistive heater disposed in said pressure chamber and in thermal contact with said liquid.

10. The vapor fuser apparatus of claim 9, wherein said means for controlling further comprises a pressure regulator communicating with a region of the pressure chamber located above said liquid.

11. A method for fusing a toner material onto a substrate in a xerographic system, the method comprising:
generating temperature and pressure conditions inside a pressure chamber containing a heat transfer fluid such that an internal pressure of heat transfer vapor in said pressure chamber is different from an atmospheric pressure external to said pressure chamber, and such that an internal temperature of said pressure chamber is equal to or greater than a boiling point temperature of said heat transfer fluid at said pressure conditions, and
transferring said substrate with un-fused toner material disposed thereon through said pressure chamber without significantly changing a pressure differential between said internal pressure and said atmospheric pressure, whereby said substrate is heated to said internal temperature and said toner material is fused to said substrate.

12. The method of claim 11 wherein variations in temperature of the substrate both above and below a saturation temperature are caused to approach the same temperature after passage through said pressure chamber.

* * * * *